United States Patent
Gill (10) Patent No.: US 11,894,643 B2
(45) Date of Patent: Feb. 6, 2024

(54) METER BLOCK ADAPTOR AND METHOD (71) Applicant: E.J. Brooks Company, Novi, MI (US)

(72) Inventor: David K. Gill, Ortonville, MI (US)

(73) Assignee: E.J. BROOKS COMPANY, Novi, MI (US)

( * ) Notice: Subject to any disclaimer, the term of this patent is extended or adjusted under 35 U.S.C. 154(b) by 267 days.

(21) Appl. No.: 17/344,714

(22) Filed: Jun. 10, 2021

(65) Prior Publication Data
US 2022/0368092 A1 Nov. 17, 2022

Related U.S. Application Data (60) Provisional application No. 63/187,571, filed on May 12, 2021.

(51) Int. Cl.
| H01R 31/06 | (2006.01) |
| H01R 13/621 | (2006.01) |
| G01R 11/04 | (2006.01) |

(52) U.S. Cl.
CPC ............ H01R 31/06 (2013.01); G01R 11/04 (2013.01); H01R 13/6215 (2013.01)

(58) Field of Classification Search
CPC ..... H01R 31/06; H01R 13/6215; G01R 11/04
See application file for complete search history.

(56) References Cited

U.S. PATENT DOCUMENTS

| D27,899 S | 11/1897 | Homan | |
| 3,744,010 A * | 7/1973 | Meacham | G01R 11/04 439/301 |
| 4,772,213 A | 9/1988 | Bell | |
| 4,823,572 A | 4/1989 | Signorelli | |
| 4,872,847 A * | 10/1989 | Fennell | G01R 11/04 439/133 |
| 4,960,393 A * | 10/1990 | Stoll | F15B 13/0857 439/651 |
| 5,334,057 A * | 8/1994 | Blackwell | H01R 13/112 439/839 |
| 5,571,031 A | 11/1996 | Robinson | |
| 5,577,933 A * | 11/1996 | Robinson | H01R 13/44 439/508 |
| 5,595,506 A | 1/1997 | Robinson et al. | |
| 5,788,529 A * | 8/1998 | Borzi | H01R 9/2458 29/830 |
| 5,996,402 A * | 12/1999 | Harris | G01M 3/26 73/40 |

(Continued)

OTHER PUBLICATIONS

USPTO Non-Final Office Action dated Mar. 16, 2023 in related U.S. Appl. No. 29/794,181 (22 pages).

*Primary Examiner* — Thanh Tam T Le
(74) *Attorney, Agent, or Firm* — Vedder Price P.C.

(57) ABSTRACT

An electric meter adaptor includes a housing having a meter block end and a meter end opposite the meter block end. The meter adaptor includes a pair of first blades supported by the housing and extending from the meter block end to the meter end, each of the first blades having a line connector at the meter block end and a meter connector at the meter block end. The meter adaptor includes a pair of second blades supported by the housing at the meter block end, each of the second blades having a load connector. The meter adaptor includes a pair of third blades supported by the housing at the meter end, each of the third blades having a second meter connector.

19 Claims, 9 Drawing Sheets (56) References Cited

U.S. PATENT DOCUMENTS

| | | | |
|---|---|---|---|
| 6,059,605 A | 5/2000 | Robinson et al. | |
| 6,118,269 A | 9/2000 | Davis | |
| 6,152,764 A * | 11/2000 | Robinson | G01R 11/04 |
| | | | 361/666 |
| 6,176,262 B1 | 1/2001 | Nimberger | |
| 6,200,158 B1 | 3/2001 | Robinson | |
| 6,325,666 B1 | 12/2001 | Robinson et al. | |
| 6,478,589 B2 | 11/2002 | Robinson et al. | |
| 6,520,798 B1 * | 2/2003 | Robinson | G01R 11/04 |
| | | | 361/663 |
| 6,589,072 B2 | 7/2003 | Robinson et al. | |
| D483,276 S | 12/2003 | Schabbach | |
| 6,748,802 B1 | 6/2004 | Hendey | |
| 6,752,652 B1 | 6/2004 | Robinson | |
| D613,196 S | 4/2010 | Kabaya | |
| D642,536 S | 8/2011 | Robinson | |
| 8,002,578 B2 | 8/2011 | Robinson et al. | |
| D696,222 S | 12/2013 | Jia | |
| D712,765 S | 9/2014 | Kulkarni | |
| 9,030,190 B2 | 5/2015 | Matt | |
| 9,807,896 B2 | 10/2017 | Arai | |
| 10,020,627 B1 * | 7/2018 | Olson | H01R 13/447 |
| 10,089,641 B2 | 10/2018 | Parks et al. | |
| 10,132,838 B2 * | 11/2018 | Parks | G01R 3/00 |
| D878,228 S | 3/2020 | Takano | |
| D899,280 S | 10/2020 | Takano | |
| D956,592 S | 7/2022 | Taguchi | |
| 2007/0117436 A1 | 5/2007 | Davis | |
| 2007/0148058 A1 | 6/2007 | Buckel | |
| 2010/0171506 A1 | 7/2010 | Norgaard | |
| 2013/0327157 A1 | 12/2013 | Verhaagen | |
| 2013/0328545 A1 | 12/2013 | Rudaitis et al. | |
| 2022/0368092 A1 | 11/2022 | Gill | |
| 2023/0038566 A1 | 2/2023 | Gill | |

* cited by examiner

METER BLOCK ADAPTOR AND METHOD

CROSS-REFERENCE TO RELATED APPLICATIONS

The subject patent application claims priority to and all the benefits of Provisional Patent Application U.S. 63/187,571 filed on May 12, 2021, which is herein incorporated by reference in its entirety.

BACKGROUND

Buildings and other structures are typically electrically connected to an electrical grid that delivers power from a utility power source to the building. The utility power source may be, for example, a coal plant, a nuclear plant, a hydro-electric dam, a solar farm, a wind farm, etc. An electrical meter is installed at an electrical connection of the building to the electrical grid. The electrical meter, also known as a watthour meter, measures an amount electrical power consumed at the build and supplied via the electrical grid. The amount of measured electrical power may be used to determine how much a consumer should be billed by an operator of the utility power source.

Sometimes, after the building is connected to the electrical grid and electrical power is provided via the meter, a backup power source may be electrically connected to the building. The backup power source provides electrical power to the building in the event of electrical power failure from the electrical grid. The backup power source may include, for example, a plurality of batteries, an alternator and internal combustion engine, etc. A transfer switch may be used to electrically connect the backup power source to the building. The transfer switch controls whether the building is provided electrical power from the utility power source via the electrical grid or from the backup power source. The transfer switch may be electrically connected between the meter and the building.

As an initial step to connecting the transfer switch and generator, electrical power from the utility power source to the building is terminated. A power line technician is typically needed onsite to terminate power to the building. After termination of the electrical power, the transfer switch and the backup power source are connected to the building. An electrician is typically needed onsite to connect the transfer switch and the backup power source. After the transfer switch and the backup power source are connected, many jurisdictions require an inspection of the connection by an inspector. After the inspector approves the connect, the power line technician restores power from the utility power source to the building.

DETAILED DESCRIPTION

An electric meter adaptor enables connection of a backup power source between an electric meter block and an electric meter without terminating electrical power supplied to the meter and meter block from a utility power source. The meter adaptor includes a housing having a meter block end and a meter end opposite the meter block end. The meter adaptor includes a pair of first blades that extend from the meter block end to the meter end. Each of the first blades has a line connector at the meter block end and a meter connector at the meter block end. The meter adaptor includes a pair of second blades at the meter block end. Each of the second blades have a load connector. The meter adaptor includes a pair of third blades at the meter end. Each of the third blades have a second meter connector.

The backup power source may be connected between the electric meter block and the electric meter with meter adapter by first connecting the backup power source to the second blades and the third blades of the meter adaptor (e.g., via a transfer switch). Next, the meter adapter may be connected to the meter block and the meter may be connected to the adapter.

Figure 1:
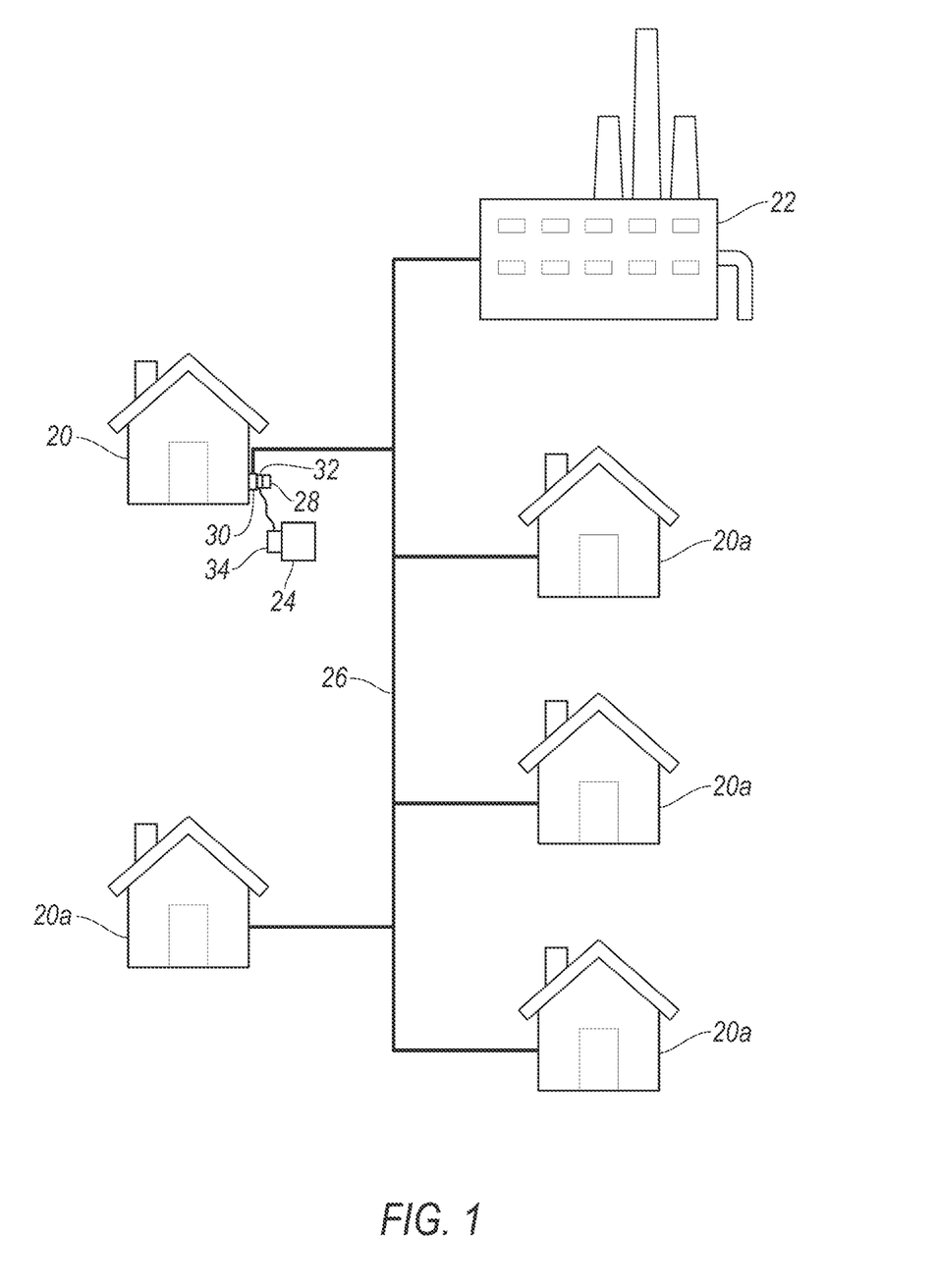
FIG. 1 is a schematic illustration of a building connected to a utility power source and a backup power source with a meter block adaptor.
Figure 2:
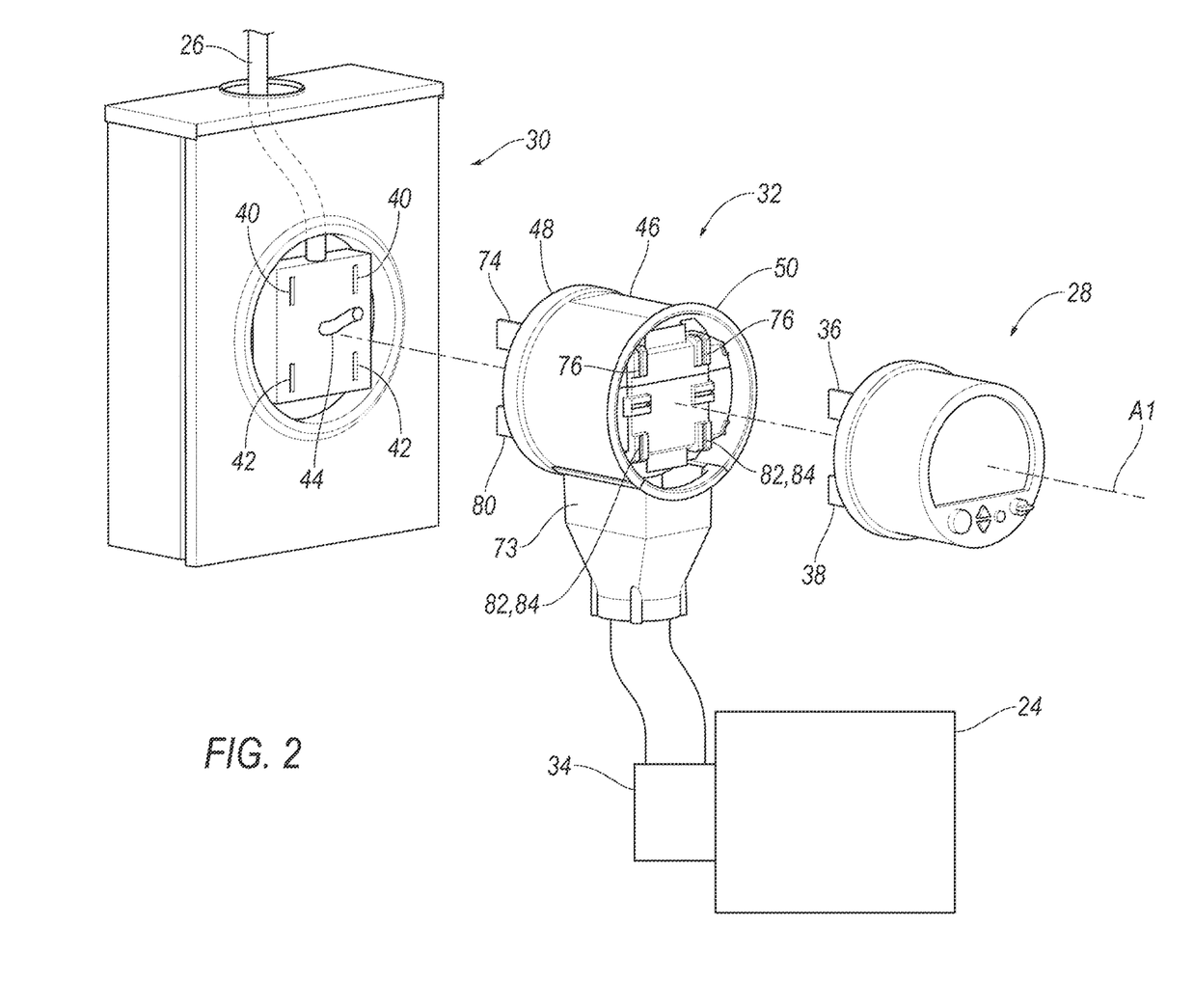
FIG. 2 is an exploded view of a meter block, the adaptor, and a meter.
Figure 3:
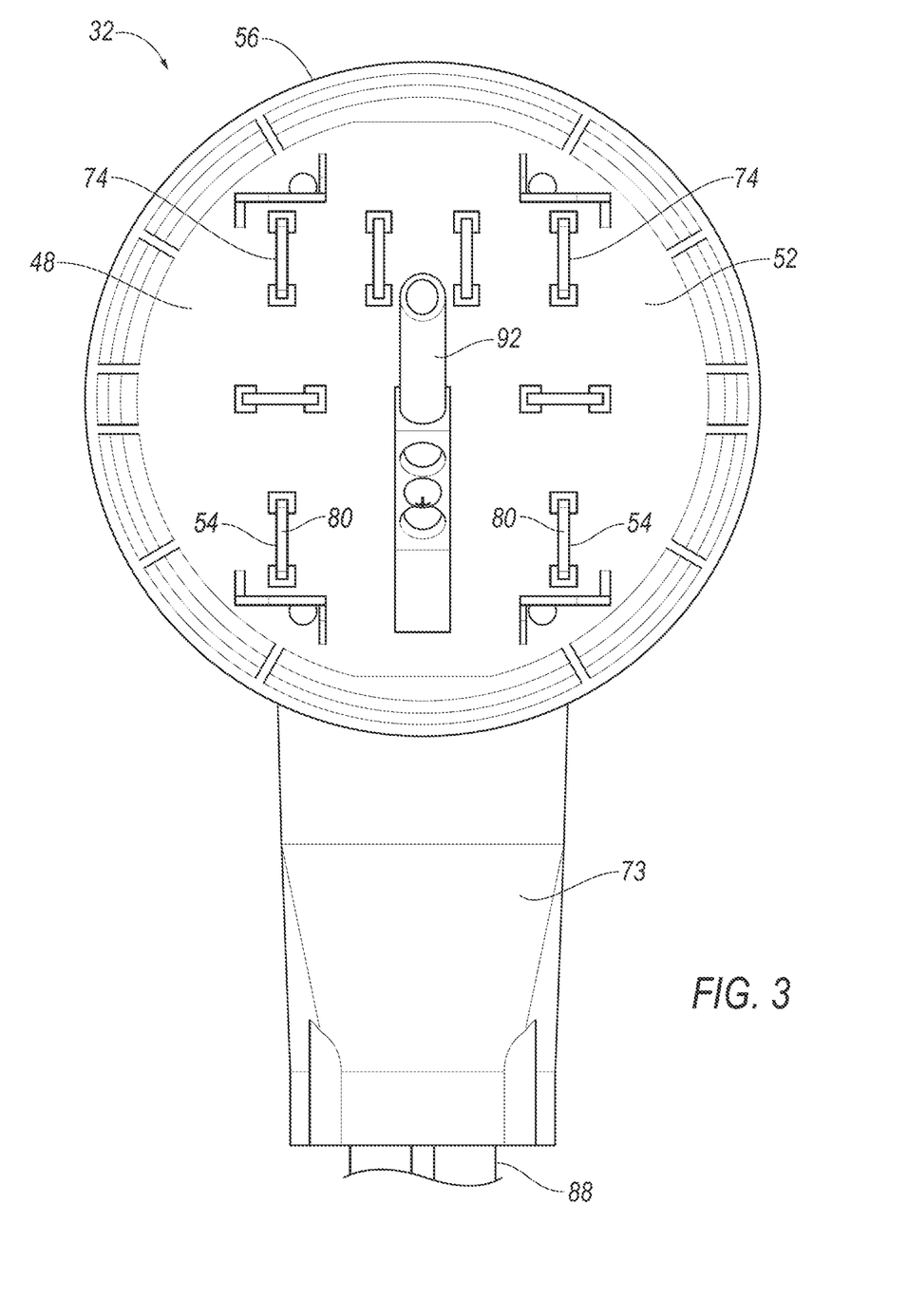
FIG. 3 is a view of a meter block end of the adaptor.
Figure 4:
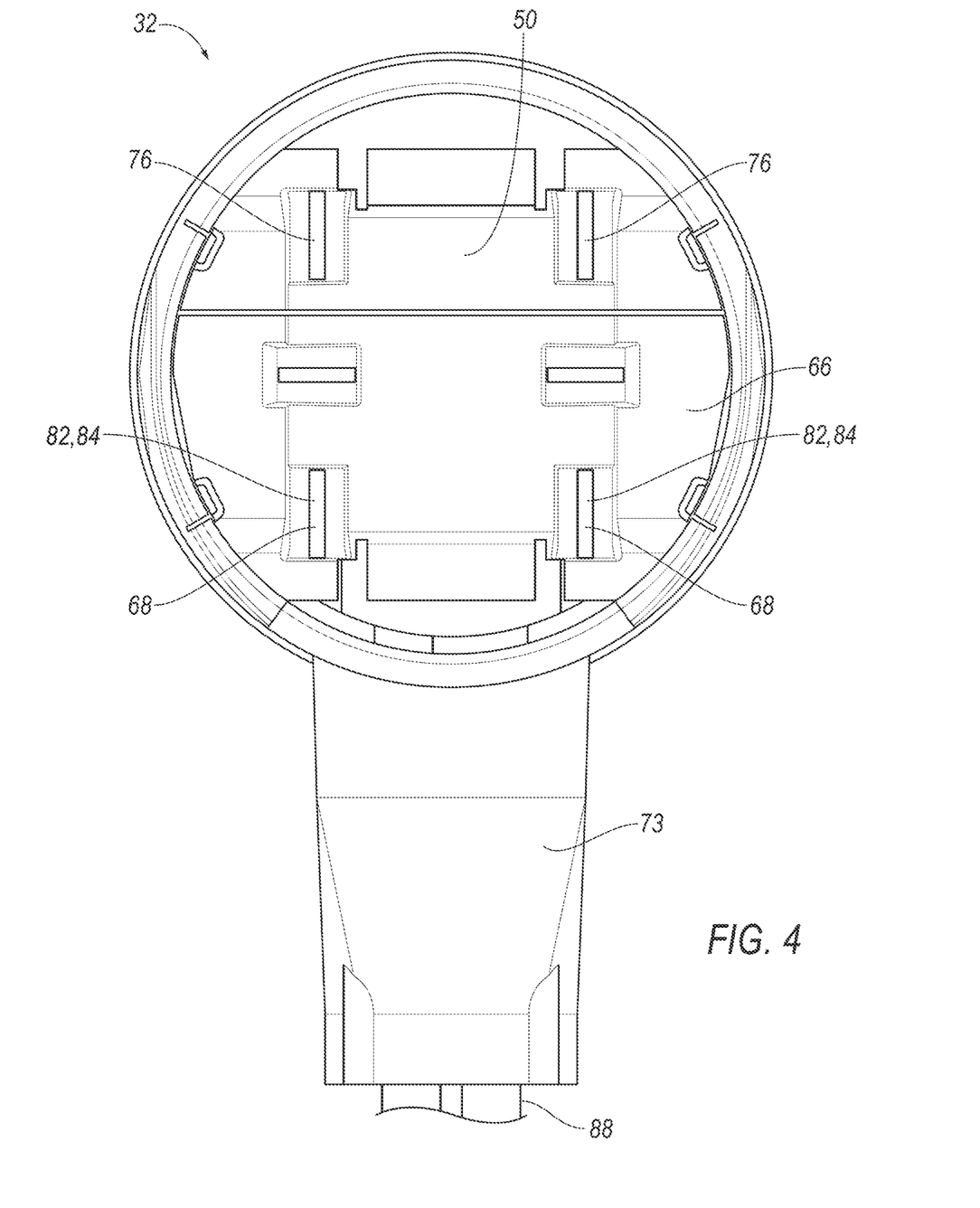
FIG. 4 is a view of a meter end of the adaptor.
Figure 5:
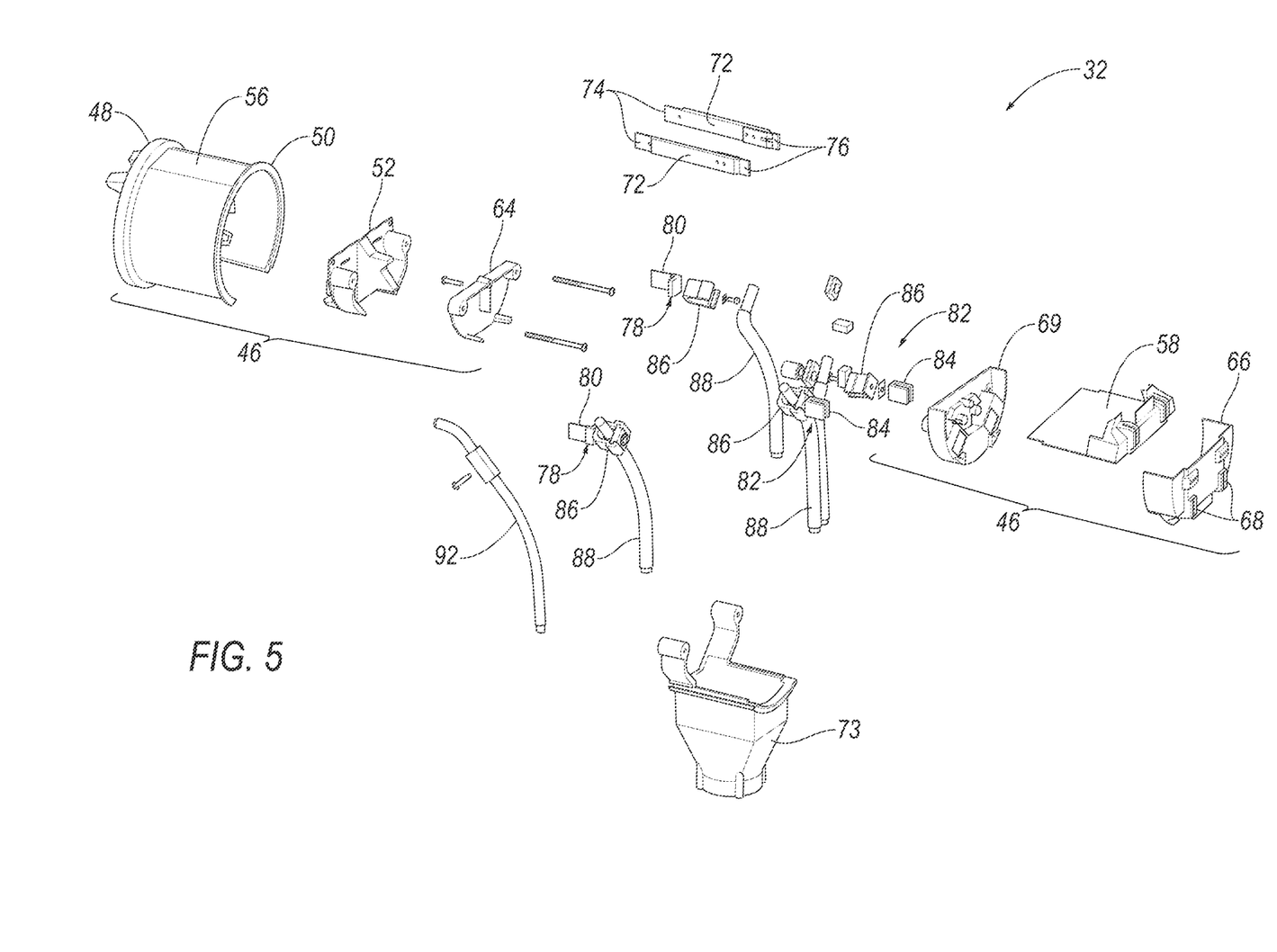
FIG. 5 is an exploded view of components of the adaptor.
Figure 6:
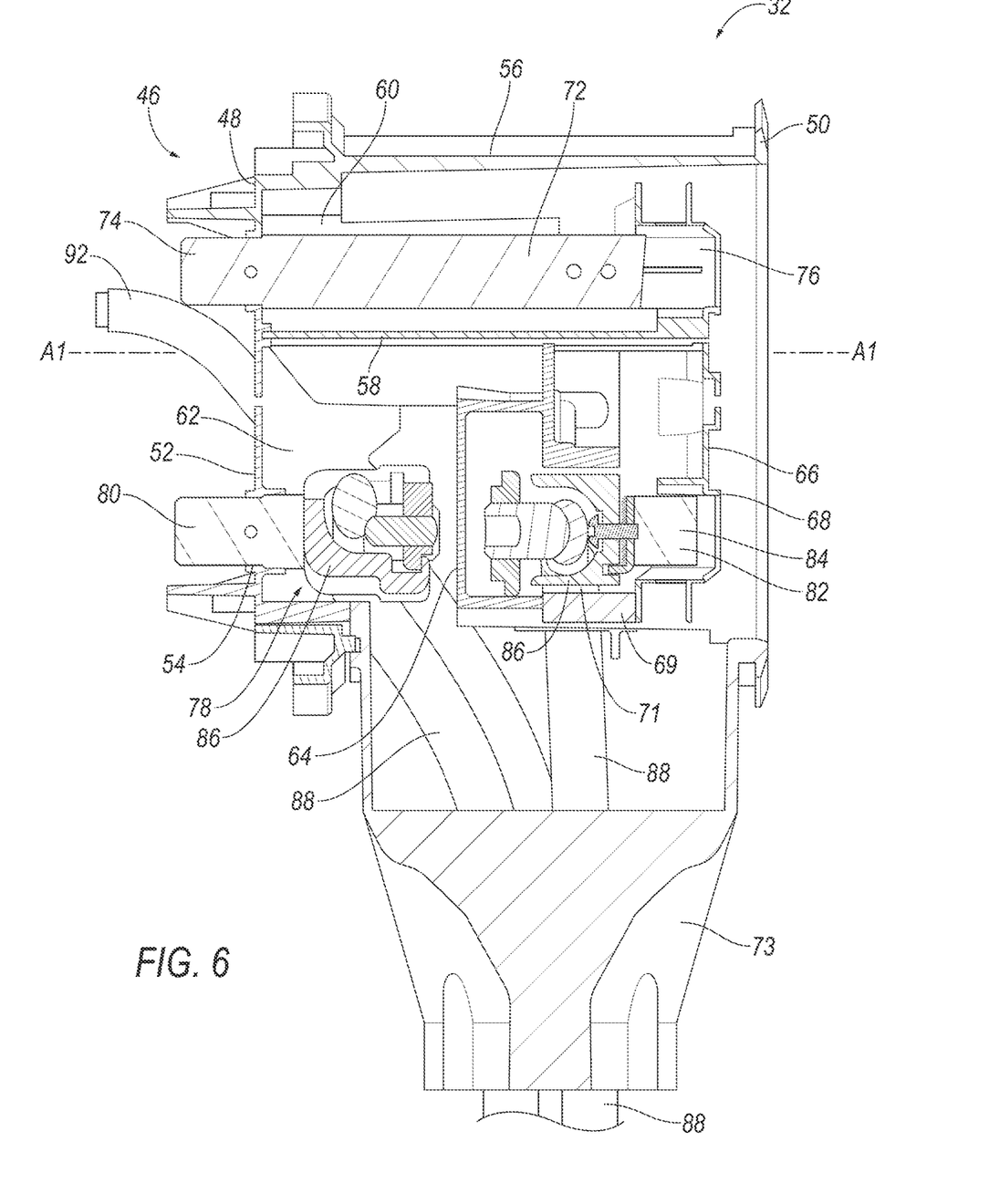
FIG. 6 is a cross section view of the adaptor.

With reference to the FIG. 1, wherein like numerals indicate like parts throughout the several views, a building 20 provided with electrical power from a utility power source 22 and from a backup power source 24 is shown. The building 20 is electrically connected to the utility power source 22 via an electrical grid 26, a meter 28, a meter block 30, an adaptor 32 connected therebetween, and a transfer switch 34 connected to the adaptor 32. The building 20 is also connected to a backup power source 24 via the meter block 30, the adaptor 32, and the transfer switch 34.

The utility power source 22 generates and provides, via the electrical grid 26, electrical power to the building 20, as well as to numerous other buildings 20a and structures that consume electrical power. The utility power source 22 may be, for example, a coal plant, a nuclear plant, a hydro-electric dam, a solar farm, a wind farm, etc.

The backup power source 24 provides electrical power to the building 20, e.g., and not to other buildings 20. The backup power source 24 may provide electrical power to the building 20, e.g., when there is an electrical power failure of the utility power source 22 and/or the electrical grid 26. The backup power source 24 may generate and/or store electrical power. For example, the backup power source 24 may include a generator that runs on, e.g., gas, gasoline, diesel fuel, etc. The generator may include an alternator and an internal combustion engine. As another example, the backup power source 24 may include solar panels, a wind and/or hydro turbine, etc. As another example, the backup power source 24 may include a bank of batteries, capacitors, or other suitable electrical power storage structure. The backup power source 24 may be, for example, an electric vehicle that provides power from a battery of such vehicle. The backup power source 24 may be capable of providing, for example, up to 48 kilowatts for residential applications and up to 190 kilowatts for commercial applications.

The meter 28 measures an amount of electrical power provided to the building 20 from the utility power source 22, e.g., in kilowatt hours. For example, the meter 28 may be an electromechanical induction meter operates through electromagnetic induction. The meter 28 may be electronic, and include a power supply, a metering engine, a processing and communication engine (i.e. a microcontroller), and other add-on modules such as a real time clock (RTC), a liquid crystal display, infra-red communication ports/modules and so on. The meter 28 may be able to be read remotely, e.g., via low-power radio, GSM, GPRS, Bluetooth, IrDA, cellular, Zigbee, WiFi, telephone lines or over the power grid 26. The meter 28 includes a pair of line connectors 36 that can receive electrical power from the utility power source 22, e.g., via the meter block 30. The meter 28 includes a pair of load connectors 38 that can provide electrical power to the building 20, e.g., via the load connector 38 of the meter block 30. Electrical power from received at the line connectors 36 is transmitted through the meter 28 to the load connectors 38. The meter 28 measures an amount of electrical power that flows from the line connectors 36 to the load connectors 38. The line connectors 36 and the load connectors 38 of the meter 28 may be male connectors. For example, the line connectors 36 and the load connectors 38 may each include a blade or other suitable structure for insertion into a female connector. The blades may extend outside of a housing of the meter 28.

The meter block 30 enables the meter 28 to be installed and removed, e.g., for service or replacement. The meter block 30 includes a pair of line connectors 40 that receive electrical power from the utility power source 22. For example, the line connectors 40 of the meter block 30 may be hardwired to the electrical grid 26. The meter block 30 includes a pair of load connectors 42 that provide electrical power to the building 20. For example, the load connectors 42 may be hardwired to a junction box or circuit breaker panel of an electrical system of the building 20. The line connectors 40 and the load connectors 42 of the meter block 30 may be female connectors. For example, the line connectors 40 and the load connectors 42 may each include jaws or other suitable structure for receiving a male connector. The jaws may be internal of a housing of the meter block 30. The meter block 30 may include a neutral wire 44 that is electrically connected to a ground. The ground may be a wire connected to the earth.

With reference to FIGS. 2-8, the adaptor 32 enables connection of the transfer switch 34 and the backup power source 24 between the meter 28 and the meter block 30. The adaptor 32 includes a housing 46 having a meter block end 48. The meter block end 48 is connectable to the meter block 30. The housing 46 has a meter end 50 opposite the meter block end 48. The meter end 50 is connectable to the meter 28. The meter block end 48 is spaced from the meter end 50 along an axis A1. The housing 46 may include a panel 52 at the meter block end 48. The panel 52 may include a plurality of slots 54 that extend through the panel 52. The housing 46 may include an outer shell 56 extending from the panel 52 at the meter block end 48 to the meter end 50. The housing 46 may include a first wall 58 inside the outer shell 56. The first wall 58 may extend from the panel 52 at the meter block end 48 to the meter end 50, e.g., along the axis A1. The housing 46 may define a first chamber 60 and a second chamber 62, e.g., within the outer shell 56 and between the meter block end 48 and the meter end 50. The first wall 58 may provide a barrier between the first chamber 60 and the second chamber 62. The housing 46 may include a second wall 64. The second wall 64 may extend perpendicularly from the first wall 58. The housing 46 may include a shield 66. The shield 66 may be fixed to, for example, the outer shell 56. The shield 66 may include one or more slots 68 that extend through the shield 66 to the first chamber 60 and the second chamber 62. The shield 66 may be transparent. The housing 46 may include a support member 69, e.g., within the outer shell 56. The support member 69 supports other components the adaptor 32, e.g., via one or more openings 71. The support member 69 may be between the second wall 64 and the shield 66 along the axis A1. The housing 46 may have one or more other openings, e.g., defined in the outer shell 56. The housing 46 may plastic, or any other suitable non-conductive material.

The assembly includes a pair of first blades 72 that conduct electrical power between the meter block 30 and the meter 28. The first blades 72 are supported by the housing 46, e.g., in the first chamber 60. The first blades 72 extend from the meter block end 48 to the meter end 50, e.g., from the panel 52 at the meter block end 48 to the meter end 50. The first blades 72 may be elongated along the axis A1. In other words, a length of the first blades 72 along the first axis A1 may be greater than a width and a height of the first blades 72 perpendicular to the axis A1.

Each of the first blades 72 have a line connector 74 at the meter block end 48 of the housing 46. The line connectors 74 of the first blades 72 are connectable to the line connectors 40 of the meter block 30. The line connectors 74 of the first blades 72 may be male connectors. For example, the line connectors 74 of the first blades 72 may include portions of the first blades 72 that extend outside of the first chamber 60 through the slots 54 of the panel 52 at the meter block end 48 and are insertable into the female line side connectors 40 of the meter block 30.

Each of the first blades 72 have a meter connector 76 at the meter block end 48 of the housing 46. The meter connectors 76 of the first blades 72 are connectable to the meter 28, e.g., to the line connectors 36 of the meter 28. The meter connectors 76 of the first blades 72 may be female. For example, the meter connectors 76 of the first blades 72 may each include jaws or other suitable structure for receiving the blade of the male line connectors 36 of the meter 28. The jaws may be internal of the housing 46 of the adaptor 32. The jaws may align with the slots 68 of the shield 66 at the meter end 50.

The assembly includes a pair of second blades 78 that conduct electrical power between, for example, the meter block 30 and the transfer switch 34. The second blades 78 are supported by the housing 46 at the meter block end 48, e.g., in the second chamber 62. Each of the second blades 78 have a load connector 80 connectable to the load connectors 42 of the meter block 30. The load connectors 80 of the second blades 78 may be male connectors. For example, the load connectors 80 of the second blades 78 may include portions of the second blades 78 that extend outside of the second chamber 62 through the slots 54 of the panel 52 at the meter block end 48 and are insertable into the female load side connectors 42 of the meter block 30.

The assembly includes a pair of third blades 82 that conduct electrical power between, for example, the meter 28 and the transfer switch 34. Each of the third blades 82 have a meter connector 84. The third blades 82 are supported by the housing 46 at the meter end 50, e.g., in the second chamber 62. The third blades 82 may be supported by support member 69. For example, the meter connectors 84 may be supported within the openings 71. The meter connectors 84 of the third blades 82 are connectable to the meter 28, e.g., to the load connectors 38 of the meter 28. The meter connectors 84 of the third blades 82 may be female. For example, the meter connectors 84 of the third blades 82 may each include jaws or other suitable structure for receiving the blade of the male load connectors 38 of the meter 28. The jaws may be internal of the housing 46 of the adaptor 32. The jaws may align with the slots 54 of the shield 66 at the meter end 50.

The first blades 72, the second blades 78, and the third blades 82 may be copper, or any suitable electrically conductive material. The first blades 72, the second blades 78, and the third blades 82 may each include tin plating. The tin plating may help protection against corrosion, e.g., of the copper of the first blades 72, the second blades 78, and the third blades 82.

The first blades 72 are electrically isolated from the second blades 78 and the third blades 82, e.g., such that electrical power cannot flow from the first blades 72 to the second blades 78 or the third blades 82 and vice versa. For example, the first wall 58 of the housing 46 may be between and separate the first blades 72 from the second blades 78 and the third blades 82 and inhibit a direct electrical connection therebetween. The second blades 78 are electrically isolated from the third blades 82. For example, the second blades 78 are spaced from the third blades 82, e.g., along the axis A1 and without any structure in the second chamber 62 providing a direct electrical connection therebetween. As a further example, the second wall 64 may be between and separate the second blades 78 from the third blades 82 and inhibit a direct electrical connection therebetween.

The assembly may include a plurality of wire lugs 86. The wire lugs 86 enable connection of components, such as the transfer switch 34 and the backup power source 24. One wire lug 86 may be connected to each of the second blades 78 and the third blades 82, e.g., with a fastener, weld, solder, etc. The wire lugs 86 may be, for example, lay in lugs having a receiver body, a plate, and a set screw. Wires 88 from the transfer switch 34 may be fixed to the wire lugs 86. For example, ends of the wires 88 may be inserted into the receiver body and the plate may be engaged to the receiver body, e.g., with the wire 88 therebetween. The set screw may be tightened into a threaded hole of the plate, compressing the end of the wire 88 against the receiver body.

Figure 7:
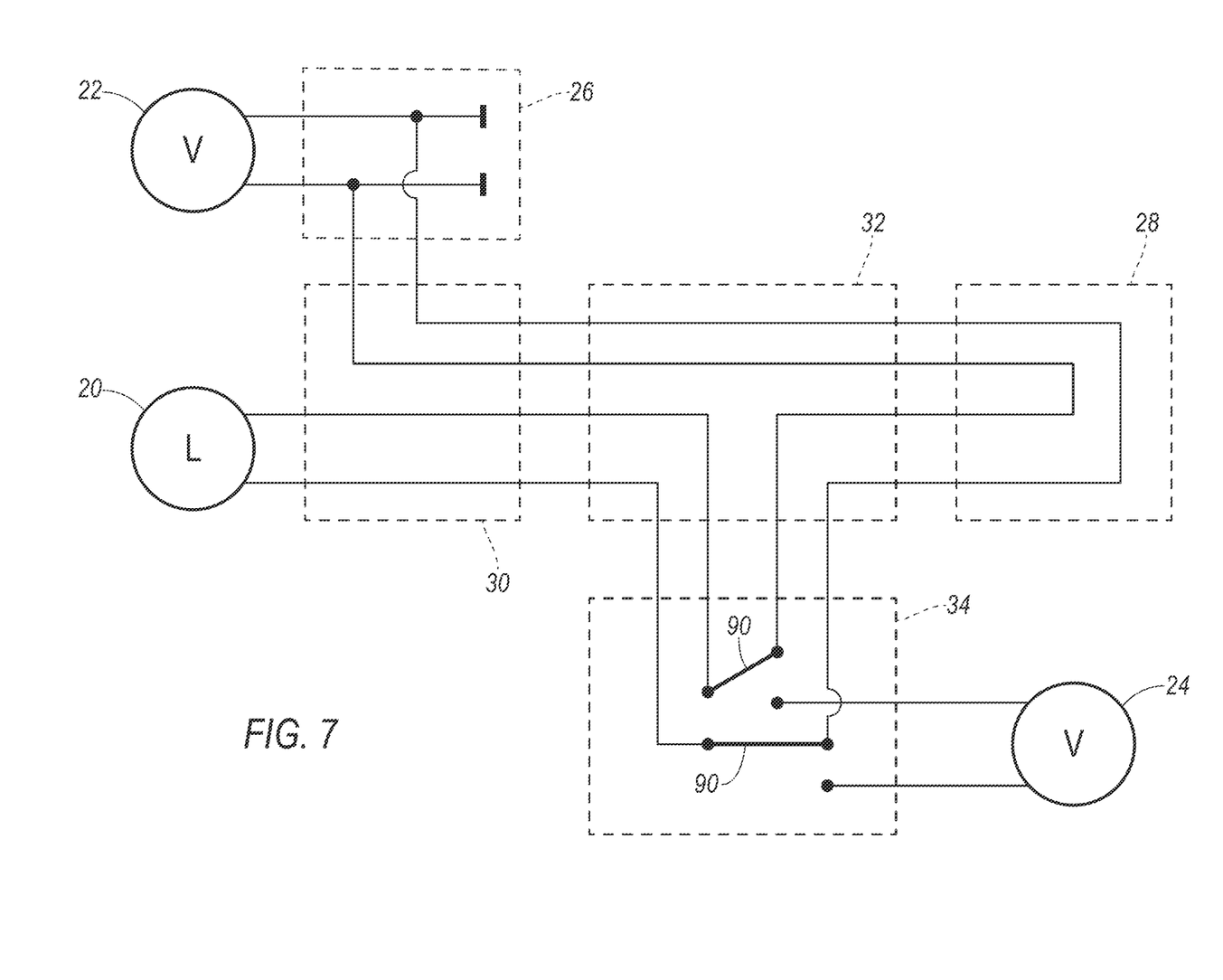
FIG. 7 is a schematic showing a transfer switch connecting the utility power source to the meter block via the adaptor.
Figure 8:
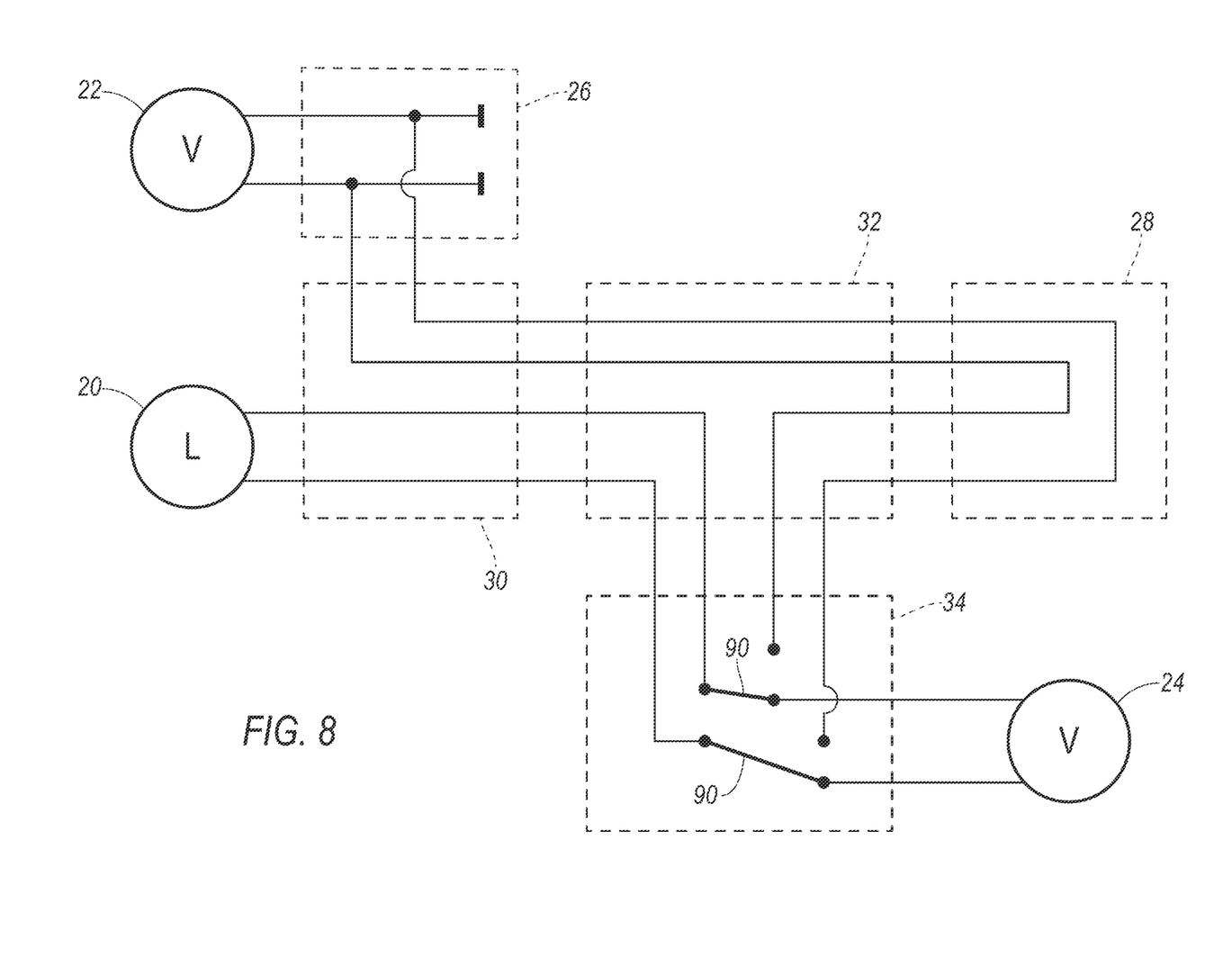
FIG. 8 is a schematic showing the transfer switch connecting the backup power source to the meter block via the adaptor.

The transfer switch 34 selectively connects the load connector 42 of the meter block 30 to the backup power source 24 or to the meter 28, the electrical grid 26 and the utility power source 22, i.e., such that the load connector 42 of the meter block 30 receives electrical power from either the backup power source 24 or the utility power source 22 (but not both at once). The transfer switch 34 is connected to the second blades 78 and the third blades 82, e.g., via the wires 88 fixed to the wire lugs 86. The transfer switch 34 may be connected to the backup power source 24, e.g., via other wires. The transfer switch 34 may include one or more switches 90 movable from a first position to a second position, and vice versa. The switches 90 in the first position may define an electrical circuit that extends from the second blades 78 to the backup power source 24 and bypasses the third blades 82, i.e., such that the second blades 78 are electrically connected to the backup power source 24 and not to the third blades 82. The switches 90 in the second position may define an electrical circuit that extends from the second blades 78 to the third blades 82, the meter 28, the grid 26, and the utility power source 22 and bypasses the backup power source 24, i.e., such that the second blades 78 are electrically connected to the utility power source 22 via third blades 82 and not to the backup power source 24.

The adaptor 32 may include a neutral wire 92 supported by the housing 46. The neutral wire 92 may be connected to, for example, the neutral wire 44 of the meter block 30. The neutral wire 92 of the adaptor 32 may further be connected to a neutral wire 94 of the transfer switch 34.

Figure 9:
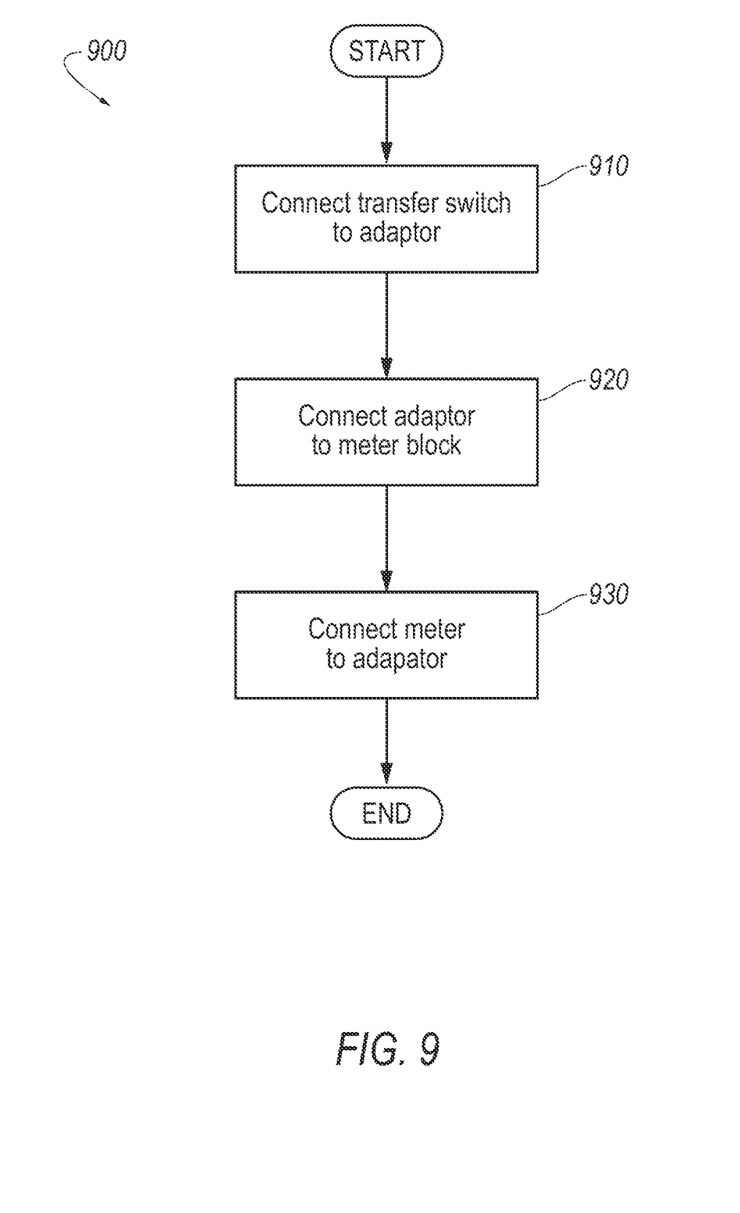
FIG. 9 is a flow chart illustrating a process of installing the adaptor, transfer switch, and backup power source.

FIG. 9 is a process flow diagram illustrating an exemplary process 900 for connecting the backup power source 24 between the meter block 30 and the meter 28 with the meter 28 adaptor 32. The process may be performed without terminating electrical power from the utility power source 22 to the meter block 30. The process begins in a block 910.

At the block 910 the transfer switch 34 is connected to the electric meter 28 adaptor 32. For example, the wires 88 of the transfer switch 34 may be secured to the wire lugs 86 of the second blades 78 and the third blades 82. Also at the block 910, the neural wire 88 of the adaptor 32 may be connected to the neutral wire 94 of the meter block 30 and the neural wire 94 of the transfer switch 34. For example, the neural wire 92 of the adaptor 32 may be spliced or otherwise electrically connected to the neutral wire 44 of the meter block 30 and the neural wire 94 of the transfer switch 34.

Next, at a block 920 the line connectors 74 and load connectors 80 of the electric meter adaptor 32 are connected to the meter block 30. For example, the blades of the male line connectors 74 of the first blades 72 and the male load connectors 80 of the second blades 78 may be inserted into the jaws of the line connectors 40 and the load connectors 42 of the meter block 30.

Lastly, at a block 930 the meter 28 is connected to the electric meter adaptor 32. For example, the blades of the line connectors 36 and the load connectors 38 of the meter 28 may be inserted through the slots 68 of the shield 66 at the meter end 50 of the housing 46 and into the jaws of the meter connectors 76, 84 of the first blades 72 and the third blades 82.

The numerical terms adverbs "first," "second," and "third" are used herein merely as identifiers and do not signify order or importance.

In the drawings, the same reference numbers indicate the same elements. Further, some or all of these elements could be changed. With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. An electric meter adaptor, comprising:
a housing having a meter block end and a meter end opposite the meter block end;
a pair of first blades supported by the housing and extending from the meter block end to the meter end, each of the first blades having a line connector at the meter block end and a meter connector at the meter block end;

a pair of second blades supported by the housing at the meter block end, each of the second blades having a load connector; and a pair of third blades supported by the housing at the meter end, each of the third blades having a second meter connector;

wherein the line connectors and the load connectors are male, and the meter connectors and the second meter connectors are female.

2. The electric meter adaptor of claim 1, further comprising a plurality of wire lugs, one wire lug of the plurality of wire lugs connected to each of the second blades and the third blades.

3. The electric meter adaptor of claim 1, wherein the first blades are elongated along an axis, and the second blades are spaced from the third blades along the axis.

4. The electric meter adaptor of claim 1, wherein the housing includes a wall separating the first blades from the second blades and the third blades.

5. The electric meter adaptor of claim 1, wherein the housing defines a first chamber and a second chamber, the first blades in the first chamber, and the second blades and the third blades in the second chamber.

6. The electric meter adaptor of claim 1, further comprising a transfer switch connected to the second blades and the third blades.

7. The electric meter adaptor of claim 6, further comprising a backup power source connected to the transfer switch.

8. The electric meter adaptor of claim 7, wherein the backup power source is a generator.

9. The electric meter adaptor of claim 8, wherein the generator is capable of providing up to 190 kilowatts.

10. The electric meter adaptor of claim 1, further comprising a neutral wire supported by the housing.

11. A method for connecting a backup power source, comprising:

connecting a transfer switch to an electric meter adaptor;

connecting line connectors and load connectors of the electric meter adaptor to a meter block; and connecting a meter to the electric meter adaptor.

12. The method of claim 11, wherein the method is performed without terminating electrical power to the meter block.

13. The method of claim 12, wherein wires of the transfer switch are connected to the electric meter adaptor before the line connectors and the load connectors of the electric meter adaptor are connected to the meter block.

14. The method of claim 11, wherein the line connectors and the meter are connected to a pair of first blades of the electric meter adaptor.

15. The method of claim 14, wherein the load connectors are connected a pair of second blades of the electric meter adaptor, and the meter is connected to a pair of third blades of the electric meter adaptor.

16. The method of claim 11, wherein the electric meter adaptor is connected between the meter block and the meter.

17. The method of claim 11, wherein the meter is electrically connected to the electric meter adaptor.

18. A method for connecting a backup power source, comprising:

connecting a transfer switch to an electric meter adaptor;

connecting line connectors and load connectors of the electric meter adaptor to a meter block; and connecting a meter to the electric meter adaptor;

wherein the method is performed without terminating electrical power to the meter block; and wherein the line connectors and the meter are connected to a pair of first blades of the electric meter adaptor.

19. The method of claim 18, wherein the load connectors are connected a pair of second blades of the electric meter adaptor, and the meter is connected to a pair of third blades of the electric meter adaptor.

* * * * *